United States Patent
Khlat et al.

(10) Patent No.: US 8,947,161 B2
(45) Date of Patent: Feb. 3, 2015

(54) LINEAR AMPLIFIER POWER SUPPLY MODULATION FOR ENVELOPE TRACKING

(71) Applicant: RF Micro Devices, Inc., Greensboro, NC (US)

(72) Inventors: Nadim Khlat, Cugnaux (FR); Philippe Gorisse, Brax (FR)

(73) Assignee: RF Micro Devices, Inc., Greensboro, NC (US)

( * ) Notice: Subject to any disclaimer, the term of this patent is extended or adjusted under 35 U.S.C. 154(b) by 37 days.

(21) Appl. No.: 13/692,084

(22) Filed: Dec. 3, 2012

(65) Prior Publication Data

US 2013/0141169 A1 Jun. 6, 2013

Related U.S. Application Data

(60) Provisional application No. 61/565,751, filed on Dec. 1, 2011.

(51) Int. Cl.
*H03G 3/20* (2006.01)
*H03F 1/02* (2006.01)
*H03F 3/24* (2006.01)

(52) U.S. Cl.
CPC ............ *H03F 1/0211* (2013.01); *H03F 1/0227* (2013.01); *H03F 2200/511* (2013.01); *H03F 3/245* (2013.01); *H03F 2200/459* (2013.01)
USPC .......................................... 330/136; 330/297

(58) Field of Classification Search
CPC ....................................................... H03G 3/20
USPC .................................. 330/136, 297, 285, 296
See application file for complete search history.

(56) References Cited

U.S. PATENT DOCUMENTS

| | | |
|---|---|---|
| 3,969,682 A | 7/1976 | Rossum |
| 3,980,964 A | 9/1976 | Grodinsky |
| 4,587,552 A | 5/1986 | Chin |
| 4,692,889 A | 9/1987 | McNeely |
| 4,831,258 A | 5/1989 | Paulk et al. |
| 4,996,500 A | 2/1991 | Larson et al. |
| 5,099,203 A | 3/1992 | Weaver et al. |

(Continued)

FOREIGN PATENT DOCUMENTS

| | | |
|---|---|---|
| EP | 0755121 A2 | 1/1997 |
| EP | 1492227 A1 | 12/2004 |

(Continued)

OTHER PUBLICATIONS

Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.

(Continued)

*Primary Examiner* — Henry Choe
(74) *Attorney, Agent, or Firm* — Withrow & Terranova, P.L.L.C.

(57) ABSTRACT

Circuitry, which includes a linear amplifier and a linear amplifier power supply, is disclosed. The linear amplifier at least partially provides an envelope power supply signal to a radio frequency (RF) power amplifier (PA) using a selected one of a group of linear amplifier supply voltages. The linear amplifier power supply provides at least one of the group of linear amplifier supply voltages. Selection of the selected one of the group of linear amplifier supply voltages is based on a desired voltage of the envelope power supply signal.

30 Claims, 9 Drawing Sheets

(56) References Cited

U.S. PATENT DOCUMENTS

| | | |
|---|---|---|
| 5,146,504 A | 9/1992 | Pinckley |
| 5,187,396 A | 2/1993 | Armstrong, II et al. |
| 5,311,309 A | 5/1994 | Ersoz et al. |
| 5,317,217 A | 5/1994 | Rieger et al. |
| 5,351,087 A | 9/1994 | Christopher et al. |
| 5,414,614 A | 5/1995 | Fette et al. |
| 5,420,643 A | 5/1995 | Romesburg et al. |
| 5,486,871 A | 1/1996 | Filliman et al. |
| 5,532,916 A | 7/1996 | Tamagawa |
| 5,541,547 A | 7/1996 | Lam |
| 5,581,454 A | 12/1996 | Collins |
| 5,646,621 A | 7/1997 | Cabler et al. |
| 5,715,526 A | 2/1998 | Weaver, Jr. et al. |
| 5,767,744 A | 6/1998 | Irwin et al. |
| 5,822,318 A | 10/1998 | Tiedemann, Jr. et al. |
| 5,898,342 A | 4/1999 | Bell |
| 5,905,407 A | 5/1999 | Midya |
| 5,936,464 A | 8/1999 | Grondahl |
| 6,043,610 A | 3/2000 | Buell |
| 6,043,707 A | 3/2000 | Budnik |
| 6,055,168 A | 4/2000 | Kotowski et al. |
| 6,070,181 A | 5/2000 | Yeh |
| 6,118,343 A | 9/2000 | Winslow |
| 6,133,777 A | 10/2000 | Savelli |
| 6,141,541 A | 10/2000 | Midya et al. |
| 6,147,478 A | 11/2000 | Skelton et al. |
| 6,198,645 B1 | 3/2001 | Kotowski et al. |
| 6,204,731 B1 | 3/2001 | Jiang et al. |
| 6,256,482 B1 | 7/2001 | Raab |
| 6,300,826 B1 | 10/2001 | Mathe et al. |
| 6,313,681 B1 | 11/2001 | Yoshikawa |
| 6,348,780 B1 | 2/2002 | Grant |
| 6,483,281 B2 | 11/2002 | Hwang |
| 6,559,689 B1 | 5/2003 | Clark |
| 6,566,935 B1 | 5/2003 | Renous |
| 6,583,610 B2 | 6/2003 | Groom et al. |
| 6,617,930 B2 | 9/2003 | Nitta |
| 6,621,808 B1 | 9/2003 | Sadri |
| 6,624,712 B1 | 9/2003 | Cygan et al. |
| 6,658,445 B1 | 12/2003 | Gau et al. |
| 6,681,101 B1 | 1/2004 | Eidson et al. |
| 6,690,652 B1 | 2/2004 | Sadri |
| 6,701,141 B2 | 3/2004 | Lam |
| 6,703,080 B2 | 3/2004 | Reyzelman et al. |
| 6,728,163 B2 | 4/2004 | Gomm et al. |
| 6,744,151 B2 | 6/2004 | Jackson et al. |
| 6,819,938 B2 | 11/2004 | Sahota |
| 6,958,596 B1 | 10/2005 | Sferrazza et al. |
| 6,995,995 B2 | 2/2006 | Zeng et al. |
| 7,038,536 B2 | 5/2006 | Cioffi et al. |
| 7,043,213 B2 | 5/2006 | Robinson et al. |
| 7,058,373 B2 | 6/2006 | Grigore |
| 7,099,635 B2 | 8/2006 | McCune |
| 7,200,365 B2 | 4/2007 | Watanabe et al. |
| 7,233,130 B1 | 6/2007 | Kay |
| 7,253,589 B1 | 8/2007 | Potanin et al. |
| 7,254,157 B1 | 8/2007 | Crotty et al. |
| 7,279,875 B2 | 10/2007 | Gan et al. |
| 7,394,233 B1 | 7/2008 | Trayling et al. |
| 7,405,618 B2 * | 7/2008 | Lee et al. .................. 330/136 |
| 7,411,316 B2 | 8/2008 | Pai |
| 7,414,330 B2 | 8/2008 | Chen |
| 7,515,885 B2 | 4/2009 | Sander et al. |
| 7,528,807 B2 | 5/2009 | Kim et al. |
| 7,529,523 B1 | 5/2009 | Young et al. |
| 7,539,466 B2 | 5/2009 | Tan et al. |
| 7,595,569 B2 | 9/2009 | Amerom et al. |
| 7,609,114 B2 | 10/2009 | Hsieh et al. |
| 7,615,979 B2 | 11/2009 | Caldwell |
| 7,627,622 B2 | 12/2009 | Conrad et al. |
| 7,646,108 B2 | 1/2010 | Paillet et al. |
| 7,653,366 B2 | 1/2010 | Grigore |
| 7,679,433 B1 * | 3/2010 | Li .............................. 330/10 |
| 7,684,216 B2 | 3/2010 | Choi et al. |
| 7,696,735 B2 | 4/2010 | Oraw et al. |
| 7,715,811 B2 | 5/2010 | Kenington |
| 7,724,837 B2 | 5/2010 | Filimonov et al. |
| 7,773,691 B2 | 8/2010 | Khlat et al. |
| 7,777,459 B2 | 8/2010 | Williams |
| 7,782,036 B1 | 8/2010 | Wong et al. |
| 7,783,269 B2 | 8/2010 | Vinayak et al. |
| 7,800,427 B2 | 9/2010 | Chae et al. |
| 7,805,115 B1 | 9/2010 | McMorrow et al. |
| 7,859,336 B2 | 12/2010 | Markowski et al. |
| 7,880,547 B2 | 2/2011 | Lee et al. |
| 7,894,216 B2 | 2/2011 | Melanson |
| 7,898,268 B2 | 3/2011 | Bernardon et al. |
| 7,898,327 B2 * | 3/2011 | Nentwig .................. 330/149 |
| 7,907,010 B2 | 3/2011 | Wendt et al. |
| 7,915,961 B1 * | 3/2011 | Li ............................ 330/297 |
| 7,923,974 B2 | 4/2011 | Martin et al. |
| 7,965,140 B2 * | 6/2011 | Takahashi ............... 330/136 |
| 7,994,864 B2 | 8/2011 | Chen et al. |
| 8,000,117 B2 | 8/2011 | Petricek |
| 8,008,970 B1 | 8/2011 | Homol et al. |
| 8,022,761 B2 | 9/2011 | Drogi et al. |
| 8,026,765 B2 | 9/2011 | Giovannotto |
| 8,044,639 B2 | 10/2011 | Tamegai et al. |
| 8,068,622 B2 | 11/2011 | Melanson et al. |
| 8,081,199 B2 | 12/2011 | Takata et al. |
| 8,093,951 B1 | 1/2012 | Zhang et al. |
| 8,159,297 B2 | 4/2012 | Kumagai |
| 8,164,388 B2 | 4/2012 | Iwamatsu |
| 8,174,313 B2 | 5/2012 | Vice |
| 8,183,917 B2 | 5/2012 | Drogi et al. |
| 8,183,929 B2 | 5/2012 | Grondahl |
| 8,198,941 B2 | 6/2012 | Lesso |
| 8,204,456 B2 | 6/2012 | Xu et al. |
| 8,274,332 B2 | 9/2012 | Cho et al. |
| 8,289,084 B2 | 10/2012 | Morimoto et al. |
| 8,362,837 B2 | 1/2013 | Koren et al. |
| 8,541,993 B2 | 9/2013 | Notman et al. |
| 8,542,061 B2 | 9/2013 | Levesque et al. |
| 8,548,398 B2 | 10/2013 | Baxter et al. |
| 8,558,616 B2 | 10/2013 | Shizawa et al. |
| 8,588,713 B2 | 11/2013 | Khlat |
| 8,611,402 B2 | 12/2013 | Chiron |
| 8,618,868 B2 | 12/2013 | Khlat et al. |
| 8,624,576 B2 | 1/2014 | Khlat et al. |
| 8,624,760 B2 | 1/2014 | Ngo et al. |
| 8,626,091 B2 | 1/2014 | Khlat et al. |
| 8,638,165 B2 | 1/2014 | Shah et al. |
| 8,648,657 B1 | 2/2014 | Rozenblit |
| 8,659,355 B2 * | 2/2014 | Henshaw et al. ........... 330/127 |
| 8,718,582 B2 | 5/2014 | See et al. |
| 2002/0071497 A1 | 6/2002 | Bengtsson et al. |
| 2003/0031271 A1 | 2/2003 | Bozeki et al. |
| 2003/0062950 A1 | 4/2003 | Hamada et al. |
| 2003/0137286 A1 | 7/2003 | Kimball et al. |
| 2003/0198063 A1 | 10/2003 | Smyth |
| 2003/0206603 A1 | 11/2003 | Husted |
| 2003/0220953 A1 | 11/2003 | Allred |
| 2003/0232622 A1 | 12/2003 | Seo et al. |
| 2004/0047329 A1 | 3/2004 | Zheng |
| 2004/0051384 A1 | 3/2004 | Jackson et al. |
| 2004/0124913 A1 | 7/2004 | Midya et al. |
| 2004/0184569 A1 | 9/2004 | Challa et al. |
| 2004/0196095 A1 | 10/2004 | Nonaka |
| 2004/0219891 A1 | 11/2004 | Hadjichristos |
| 2004/0239301 A1 | 12/2004 | Kobayashi |
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0047180 A1 | 3/2005 | Kim |
| 2005/0064830 A1 | 3/2005 | Grigore |
| 2005/0093630 A1 | 5/2005 | Whittaker et al. |
| 2005/0110562 A1 | 5/2005 | Robinson et al. |
| 2005/0122171 A1 | 6/2005 | Miki et al. |
| 2005/0156582 A1 | 7/2005 | Redl et al. |
| 2005/0156662 A1 | 7/2005 | Raghupathy et al. |
| 2005/0157778 A1 | 7/2005 | Trachewsky et al. |
| 2005/0200407 A1 | 9/2005 | Arai et al. |
| 2006/0006946 A1 | 1/2006 | Burns et al. |

(56) References Cited

U.S. PATENT DOCUMENTS

| | | |
|---|---|---|
| 2006/0097711 A1 | 5/2006 | Brandt |
| 2006/0128324 A1 | 6/2006 | Tan et al. |
| 2006/0178119 A1 | 8/2006 | Jarvinen |
| 2006/0181340 A1 | 8/2006 | Dhuyvetter |
| 2006/0220627 A1 | 10/2006 | Koh |
| 2006/0244513 A1 | 11/2006 | Yen et al. |
| 2007/0008804 A1 | 1/2007 | Lu et al. |
| 2007/0014382 A1 | 1/2007 | Shakeshaft et al. |
| 2007/0024360 A1 | 2/2007 | Markowski |
| 2007/0063681 A1 | 3/2007 | Liu |
| 2007/0082622 A1 | 4/2007 | Leinonen et al. |
| 2007/0146076 A1 | 6/2007 | Baba |
| 2007/0182392 A1 | 8/2007 | Nishida |
| 2007/0183532 A1 | 8/2007 | Matero |
| 2007/0259628 A1 | 11/2007 | Carmel et al. |
| 2008/0003950 A1 | 1/2008 | Haapoja et al. |
| 2008/0044041 A1 | 2/2008 | Tucker et al. |
| 2008/0081572 A1 | 4/2008 | Rofougaran |
| 2008/0104432 A1 | 5/2008 | Vinayak et al. |
| 2008/0150619 A1 | 6/2008 | Lesso et al. |
| 2008/0205095 A1 | 8/2008 | Pinon et al. |
| 2008/0242246 A1 | 10/2008 | Minnis et al. |
| 2008/0252278 A1 | 10/2008 | Lindeberg et al. |
| 2008/0258831 A1 | 10/2008 | Kunihiro et al. |
| 2008/0280577 A1 | 11/2008 | Beukema et al. |
| 2009/0004981 A1 | 1/2009 | Eliezer et al. |
| 2009/0097591 A1 | 4/2009 | Kim |
| 2009/0160548 A1 | 6/2009 | Ishikawa et al. |
| 2009/0167260 A1 | 7/2009 | Pauritsch et al. |
| 2009/0174466 A1 | 7/2009 | Hsieh et al. |
| 2009/0184764 A1* | 7/2009 | Markowski et al. .......... 330/136 |
| 2009/0190699 A1 | 7/2009 | Kazakevich et al. |
| 2009/0218995 A1 | 9/2009 | Ahn |
| 2009/0230934 A1 | 9/2009 | Hooijschuur et al. |
| 2009/0284235 A1 | 11/2009 | Weng et al. |
| 2009/0289720 A1 | 11/2009 | Takinami et al. |
| 2009/0319065 A1 | 12/2009 | Risbo |
| 2010/0001793 A1 | 1/2010 | Van Zeijl et al. |
| 2010/0019749 A1 | 1/2010 | Katsuya et al. |
| 2010/0019840 A1 | 1/2010 | Takahashi |
| 2010/0045247 A1 | 2/2010 | Blanken et al. |
| 2010/0171553 A1 | 7/2010 | Okubo et al. |
| 2010/0253309 A1 | 10/2010 | Xi et al. |
| 2010/0266066 A1 | 10/2010 | Takahashi |
| 2010/0301947 A1 | 12/2010 | Fujioka et al. |
| 2010/0308654 A1 | 12/2010 | Chen |
| 2010/0311365 A1 | 12/2010 | Vinayak et al. |
| 2010/0321127 A1 | 12/2010 | Watanabe et al. |
| 2011/0018626 A1 | 1/2011 | Kojima |
| 2011/0058601 A1 | 3/2011 | Kim et al. |
| 2011/0084760 A1 | 4/2011 | Guo et al. |
| 2011/0148375 A1 | 6/2011 | Tsuji |
| 2011/0234182 A1 | 9/2011 | Wilson |
| 2011/0235827 A1 | 9/2011 | Lesso et al. |
| 2011/0279180 A1 | 11/2011 | Yamanouchi et al. |
| 2011/0298539 A1 | 12/2011 | Drogi et al. |
| 2012/0025907 A1 | 2/2012 | Koo et al. |
| 2012/0025919 A1 | 2/2012 | Huynh |
| 2012/0034893 A1 | 2/2012 | Baxter et al. |
| 2012/0049953 A1 | 3/2012 | Khlat |
| 2012/0068767 A1 | 3/2012 | Henshaw et al. |
| 2012/0133299 A1 | 5/2012 | Capodivacca et al. |
| 2012/0139516 A1 | 6/2012 | Tsai et al. |
| 2012/0154035 A1 | 6/2012 | Hongo et al. |
| 2012/0154054 A1 | 6/2012 | Kaczman et al. |
| 2012/0170334 A1 | 7/2012 | Menegoli et al. |
| 2012/0176196 A1 | 7/2012 | Khlat |
| 2012/0194274 A1 | 8/2012 | Fowers et al. |
| 2012/0200354 A1 | 8/2012 | Ripley et al. |
| 2012/0236444 A1 | 9/2012 | Srivastava et al. |
| 2012/0244916 A1 | 9/2012 | Brown et al. |
| 2012/0299647 A1 | 11/2012 | Honjo et al. |
| 2013/0034139 A1 | 2/2013 | Khlat et al. |
| 2013/0094553 A1 | 4/2013 | Paek et al. |
| 2013/0169245 A1 | 7/2013 | Kay et al. |
| 2013/0214858 A1 | 8/2013 | Tournatory et al. |
| 2013/0229235 A1 | 9/2013 | Ohnishi |
| 2013/0307617 A1 | 11/2013 | Khlat et al. |
| 2013/0328613 A1 | 12/2013 | Kay et al. |
| 2014/0009200 A1 | 1/2014 | Kay et al. |
| 2014/0009227 A1 | 1/2014 | Kay et al. |

FOREIGN PATENT DOCUMENTS

| | | | |
|---|---|---|---|
| EP | 1569330 A1 | 8/2005 | |
| EP | 2214304 A1 | 8/2010 | |
| EP | 2244366 A1 | 10/2010 | |
| EP | 2372904 A1 | 10/2011 | |
| GB | 2462204 A | 2/2010 | |
| GB | 2465552 A | 5/2010 | |
| GB | 2484475 A | 4/2012 | |
| WO | 0048306 A1 | 8/2000 | |
| WO | 2004002006 A1 | 12/2003 | |
| WO | 2004082135 A2 | 9/2004 | |
| WO | 2005013084 A2 | 2/2005 | |
| WO | 2006021774 A1 | 3/2006 | |
| WO | 2006073208 A1 | 7/2006 | |
| WO | 2007107919 A1 | 9/2007 | |
| WO | 2007149346 A2 | 12/2007 | |
| WO | 2012151594 A2 | 11/2012 | |
| WO | 2012172544 A1 | 12/2012 | |

OTHER PUBLICATIONS

Yousefzadeh, Vahid et al., "Band Separation and Efficiency Optimization in Linear-Assisted Switching Power Amplifiers," 37th IEEE Power Electronics Specialists Conference, Jun. 18-22, 2006, pp. 1-7.

International Preliminary Report on Patentability for PCT/US2012/040317, mailed Dec. 12, 2013, 5 pages.

Notice of Allowance for U.S. Appl. No. 13/531,719, mailed Dec. 30, 2013, 7 pages.

Non-Final Office Action for U.S. Appl. No. 14/022,940, mailed Dec. 20, 2013, 5 pages.

International Search Report and Written Opinion for PCT/US2013/052277, mailed Jan. 7, 2014, 14 pages.

Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.

Cidronali, A. et al., "A 240W Dual-Band 870 and 2140 MHz Envelope Tracking GaN PA Designed by a Probability Distribution Conscious Approach," IEEE MTT-S International Microwave Symposium Digest, Jun. 5-10, 2011, 4 pages.

Dixon, N., "Standardisation Boosts Momentum for Envelope Tracking," Microwave Engineering, Europe, Apr. 20, 2011, 2 pages, http://www.mwee.com/en/standardisation-boosts-momentum-for-envelope-tracking.html? cmp_ids=71&news_ids=222901746.

Hekkala, A. et al., "Adaptive Time Misalignment Compensation in Envelope Tracking Amplifiers," 2008 IEEE International Symposium on Spread Spectrum Techniques and Applications, Aug. 2008, pp. 761-765.

Kim et al., "High Efficiency and Wideband Envelope Tracking Power Amplifiers with Sweet Spot Tracking," 2010 IEEE Radio Frequency Integrated Circuits Symposium, May 23-25, 2010, pp. 255-258.

Kim, N. et al, "Ripple Feedback Filter Suitable for Analog/Digital Mixed-Mode Audio Amplifier for Improved Efficiency and Stability," 2002 IEEE Power Electronics Specialists Conference, vol. 1, Jun. 23, 2002, pp. 45-49.

Knutson, P, et al., "An Optimal Approach to Digital Raster Mapper Design," 1991 IEEE International Conference on Consumer Electronics held Jun. 5-7, 1991, vol. 37, Issue 4, published Nov. 1991, pp. 746-752.

Le, Hanh-Phuc et al., "A 32nm Fully Integrated Reconfigurable Switched-Capacitor DC-DC Convertor Delivering 0.55W/mm$^2$ at 81% Efficiency," 2010 IEEE International Solid State Circuits Conference, Feb. 7-11, 2010, pp. 210-212.

Li, Y. et al., "A Highly Efficient SiGe Differential Power Amplifier Using an Envelope-Tracking Technique for 3GPP LTE Applications," 2010 IEEE Bipolar/BiCMOS Circuits and Technology Meeting (BCTM), Oct. 4-6, 2010, pp. 121-124.

(56) References Cited

OTHER PUBLICATIONS

Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.
Unknown, "Nujira Files 100th Envelope Tracking Patent," CS: Compound Semiconductor, Apr. 11, 2011, 1 page, http://www.compoundsemiconductor.net/csc/news-details.php?cat=news&id=1973333&key=Nujira%20Files%20100th%20Envelope%20Tracking%20Patent&type=n.
Non-final Office Action for U.S. Appl. No. 11/113,873, now Patent No. 7,773,691, mailed Feb. 1, 2008, 17 pages.
Final Office Action for U.S. Appl. No. 11/113,873, now Patent No. 7,773,691, mailed Jul. 30, 2008, 19 pages.
Non-final Office Action for U.S. Appl. No. 11/113,873, now Patent No. 7,773,691, mailed Nov. 26, 2008, 22 pages.
Final Office Action for U.S. Appl. No. 11/113,873, now Patent No. 7,773,691, mailed May 4, 2009, 20 pages.
Non-final Office Action for U.S. Appl. No. 11/113,873, now Patent No. 7,773,691, mailed Feb. 3, 2010, 21 pages.
Notice of Allowance for U.S. Appl. No. 11/113,873, now Patent No. 7,773,691, mailed Jun. 9, 2010, 7 pages.
International Search Report for PCT/US06/12619 mailed May 8, 2007, 2 pages.
Extended European Search Report for application 06740532.4 mailed Dec. 7, 2010, 7 pages.
Non-final Office Action for U.S. Appl. No. 12/112,006 mailed Apr. 5, 2010, 6 pages.
Notice of Allowance for U.S. Appl. No. 12/112,006 mailed Jul. 19, 2010, 6 pages.
Non-final Office Action for U.S. Appl. No. 13/089,917 mailed Nov. 23, 2012, 6 pages.
International Search Report for PCT/US11/033037, mailed Aug. 9, 2011, 10 pages.
International Preliminary Report on Patentability for PCT/US2011/033037 mailed Oct. 23, 2012, 7 pages.
Non-Final Office Action for U.S. Appl. No. 13/188,024, mailed Feb. 5, 2013, 8 pages.
International Search Report for PCT/US2011/044857, mailed Oct. 24, 2011, 10 pages.
International Preliminary Report on Patentability for PCT/US2011/044857 mailed Mar. 7, 2013, 6 pages.
Non-final Office Action for U.S. Appl. No. 13/218,400 mailed Nov. 8, 2012, 7 pages.
Notice of Allowance for U.S. Appl. No. 13/218,400 mailed Apr. 11, 2013, 7 pages.
International Search Report for PCT/US11/49243, mailed Dec. 22, 2011, 9 pages.
International Preliminary Report on Patentability for PCT/US11/49243 mailed Nov. 13, 2012, 33 pages.
International Search Report for PCT/US2011/054106 mailed Feb. 9, 2012, 11 pages.
International Search Report for PCT/US2011/061007 mailed Aug. 16, 2012, 16 pages.
Non-Final Office Action for U.S. Appl. No. 13/297,470 mailed May 8, 2013, 15 pages.
International Search Report for PCT/US2011/061009 mailed Feb. 8, 2012, 14 pages.
International Search Report for PCT/US2012/023495 mailed May 7, 2012, 13 pages.
Non-final Office Action for U.S. Appl. No. 13/222,453 mailed Dec. 6, 2012, 13 pages.
Notice of Allowance for U.S. Appl. No. 13/222,453 mailed Feb. 21, 2013, 7 pages.
Invitation to Pay Additional Fees and Where Applicable Protest Fee for PCT/US2012/024124 mailed Jun. 1, 2012, 7 pages.
International Search Report for PCT/US2012/024124 mailed Aug. 24, 2012, 14 pages.
Notice of Allowance for U.S. Appl. No. 13/316,229 mailed Nov. 14, 2012, 9 pages.
International Search Report for PCT/US2011/064255 mailed Apr. 3, 2012, 12 pages.
International Search Report for PCT/US2012/40317 mailed Sep. 7, 2012, 7 pages.
International Search Report for PCT/US2012/046887 mailed Dec. 21, 2012, 12 pages.
Non-final Office Action for U.S. Appl. No. 13/222,484 mailed Nov. 8, 2012, 9 pages.
Final Office Action for U.S. Appl. No. 13/222,484 mailed Apr. 10, 2013, 10 pages.
International Search Report and Written Opinion for PCT/US2012/053654 mailed Feb. 15, 2013, 11 pages.
International Search Report and Written Opinion for PCT/US2012/062070, mailed Jan. 21, 2013, 12 pages.
International Search Report and Written Opinion for PCT/US2012/067230 mailed Feb. 21, 2013, 10 pages.
Final Office Action for U.S. Appl. No. 13/297,470, mailed Oct. 25, 2013, 17 pages.
Notice of Allowance for U.S. Appl. No. 14/022,858, mailed Oct. 25, 2013, 9 pages.
Non-Final Office Action for U.S. Appl. No. 13/550,049, mailed Nov. 25, 2013, 6 pages.
Non-Final Office Action for U.S. Appl. No. 12/836,307, mailed Nov. 5, 2013, 6 pages.
Examination Report for European Patent Application No. 11720630, mailed Aug. 16, 2013, 5 pages.
Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.
Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.
Non-Final Office Action for U.S. Appl. No. 13/367,973, mailed Sep. 24, 2013, 8 pages.
Notice of Allowance for U.S. Appl. No. 13/423,649, mailed Aug. 30, 2013, 8 pages.
Notice of Allowance for U.S. Appl. No. 13/316,229, mailed Aug. 29, 2013, 8 pages.
Quayle Action for U.S. Appl. No. 13/531,719, mailed Oct. 10, 2013, 5 pages.
Notice of Allowance for U.S. Appl. No. 13/602,856, mailed Sep. 24, 2013, 9 pages.
Notice of Allowance for U.S. Appl. No. 13/188,024, mailed Jun. 18, 2013, 7 pages.
International Preliminary Report on Patentability for PCT/US2011/054106 mailed Apr. 11, 2013, 8 pages.
International Preliminary Report on Patentability for PCT/US2011/061007 mailed May 30, 2013, 11 pages.
International Preliminary Report on Patentability for PCT/US2011/061009 mailed May 30, 2013, 10 pages.
Non-Final Office Action for U.S. Appl. No. 13/423,649, mailed May 22, 2013, 7 pages.
Advisory Action for U.S. Appl. No. 13/222,484, mailed Jun. 14, 2013, 3 pages.
International Preliminary Report on Patentability for PCT/US2011/064255, mailed Jun. 20, 2013, 7 pages.
Notice of Allowance for U.S. Appl. No. 13/343,840, mailed Jul. 1, 2013, 8 pages.
Notice of Allowance for U.S. Appl. No. 13/363,888, mailed Jul. 18, 2013, 9 pages.
Notice of Allowance for U.S. Appl. No. 13/222,453, mailed Aug. 22, 2013, 8 pages.
International Preliminary Report on Patentability for PCT/US2012/024124, mailed Aug. 22, 2013, 8 pages.
Notice of Allowance for U.S. Appl. No. 13/550,060, mailed Aug. 16, 2013, 8 pages.
Notice of Allowance for U.S. Appl. No. 13/222,484, mailed Aug. 26, 2013, 8 pages.
International Preliminary Report on Patentability for PCT/US2012/023495, mailed Aug. 15, 2013, 10 pages.

(56) References Cited

OTHER PUBLICATIONS

Notice of Allowance for U.S. Appl. No. 13/297,490, mailed Feb. 27, 2014, 7 pages.
Non-Final Office Action for U.S. Appl. No. 13/297,470, mailed Feb. 20, 2014, 16 pages.
Notice of Allowance for U.S. Appl. No. 13/550,049, mailed Mar. 6, 2014, 5 pages.
International Preliminary Report on Patentability for PCT/US2012/046887, mailed Jan. 30, 2014, 8 pages.
International Preliminary Report on Patentability for PCT/US2012/053654, mailed Mar. 13, 2014, 7 pages.
Non-Final Office Action for U.S. Appl. No. 13/661,552, mailed Feb. 21, 2014, 5 pages.
International Search Report and Written Opinion for PCT/US2013/065403, mailed Feb. 5, 2014, 11 pages.
Examination Report for European Patent Application No. 11720630.0 issued Mar. 18, 2014, 4 pages.
Notice of Allowance for U.S. Appl. No. 14/022,858 mailed May 27, 2014, 6 pages.
Non-Final Office Action for U.S. Appl. No. 13/367,973 mailed Apr. 25, 2014, 5 pages.
Non-Final Office Action for U.S. Appl. No. 13/647,815 mailed May 2, 2014, 6 pages.
Non-Final Office Action for U.S. Appl. No. 13/689,883 mailed Mar. 27, 2014, 13 pages.
International Preliminary Report on Patentability for PCT/US2012/062070 mailed May 8, 2014, 8 pages.
International Search Report and Written Opinion for PCT/US2012/062110 issued Apr. 8, 2014, 12 pages.
International Preliminary Report on Patentability for PCT/US2012/062110 mailed May 8, 2014, 9 pages.
Non-Final Office Action for U.S. Appl. No. 13/684,826 mailed Apr. 3, 2014, 5 pages.
Notice of Allowance for U.S. Appl. No. 14/022,940, mailed Jun. 10, 2014, 7 pages.
Non-Final Office Action for U.S. Appl. No. 13/714,600 mailed May 9, 2014, 14 pages.
Non-Final Office Action for U.S. Appl. No. 13/951,976 mailed Apr. 4, 2014, 7 pages.
Notice of Allowance for U.S. Appl. No. 12/836,307 mailed May 5, 2014, 6 pages.
International Search Report and Written Opinion for PCT/US2014/012927, mailed Sep. 30, 2014, 11 pages.
International Search Report and Written Opinion for PCT/US2014/028178, mailed Sep. 30, 2014, 17 pages.
Non-Final Office Action for U.S. Appl. No. 12/836,307, mailed Sep. 25, 2014, 5 pages.
Advisory Action for U.S. Appl. No. 13/297,470, mailed Sep. 19, 2014, 3 pages.
Notice of Allowance for U.S. Appl. No. 13/367,973, mailed Sep. 15, 2014, 7 pages.
Notice of Allowance for U.S. Appl. No. 13/647,815, mailed Sep. 19, 2014, 6 pages.
Non-Final Office Action for U.S. Appl. No. 13/661,227, mailed Sep. 29, 2014, 24 pages.
Notice of Allowance for U.S. Appl. No. 13/684,826, mailed Sep. 8, 2014, 6 pages.
Non-Final Office Action for U.S. Appl. No. 13/714,600, mailed Oct. 15, 2014, 13 pages.
Non-Final Office Action for U.S. Appl. No. 13/747,725, mailed Oct. 7, 2014, 6 pages.
Non-Final Office Action for U.S. Appl. No. 13/297,470, mailed Oct. 20, 2014, 22 pages.
Notice of Allowance for U.S. Appl. No. 13/914,888, mailed Oct. 17, 2014, 10 pages.
Notice of Allowance for U.S. Appl. No. 14/072,140, mailed Aug. 27, 2014, 8 pages.
Non-Final Office Action for U.S. Appl. No. 14/072,225, mailed Aug. 15, 2014, 4 pages.
Non-Final Office Action for U.S. Appl. No. 13/486,012, mailed Jul. 28, 2014, 7 pages.
Notice of Allowance for U.S. Appl. No. 13/548,283, mailed Sep. 3, 2014, 7 pages.
Non-Final Office Action for U.S. Appl. No. 13/689,883, mailed Aug. 27, 2014, 12 pages.
Notice of Allowance for U.S. Appl. No. 13/661,552, mailed Jun. 13, 2014, 5 pages.
Notice of Allowance for U.S. Appl. No. 13/690,187, mailed Sep. 3, 2014, 9 pages.
Notice of Allowance for U.S. Appl. No. 13/684,826, mailed Jul. 18, 2014, 7 pages.
Non-Final Office Action for U.S. Appl. No. 13/782,142, mailed Sep. 4, 2014, 6 pages.
Hassan, Muhammad, et al., "A Combined Series-Parallel Hybrid Envelope Amplifier for Envelope Tracking Mobile Terminal RF Power Amplifier Applications," IEEE Journal of Solid-State Circuits, vol. 47, No. 5, May 1, 2012, pp. 1185-1198.
Hoversten, John, et al, "Codesign of PA, Supply, and Signal Processing for Linear Supply-Modulated RF Transmitters," IEEE Transactions on Microwave Theory and Techniques, vol. 60, No. 6, Jun. 2012, pp. 2010-2020.
European Search Report for Patent Application No. 14162682.0, issued Aug. 27, 2014, 7 pages.
International Preliminary Report on Patentability and Written Opinion for PCT/US2012/067230, mailed Jun. 12, 2014, 7 pages.
International Search Report and Written Opinion for PCT/US2014/028089, mailed Jul. 17, 2014, 10 pages.
Invitation to Pay Additional Fees and Partial International Search Report for PCT/US2014I028178, mailed Jul. 24, 2014, 7 pages.

\* cited by examiner

US 8,947,161 B2

LINEAR AMPLIFIER POWER SUPPLY MODULATION FOR ENVELOPE TRACKING

RELATED APPLICATIONS

This application claims the benefit of U.S. provisional patent application No. 61/565,751, filed Dec. 1, 2011, the disclosure of which is incorporated herein by reference in its entirety.

FIELD OF THE DISCLOSURE

Embodiments of the present disclosure relate to switching power supplies and radio frequency (RF) power amplifiers, both of which may be used in RF communication systems.

BACKGROUND

As wireless communications technologies evolve, wireless communications systems become increasingly sophisticated. As such, wireless communications protocols continue to expand and change to take advantage of the technological evolution. As a result, to maximize flexibility, many wireless communications devices must be capable of supporting any number of wireless communications protocols, each of which may have certain performance requirements, such as specific out-of-band emissions requirements, linearity requirements, or the like. Further, portable wireless communications devices are typically battery powered and need to be relatively small, and have low cost. As such, to minimize size, cost, and power consumption, RF circuitry in such a device needs to be as simple, small, and efficient as is practical. Thus, there is a need for RF circuitry in a communications device that is low cost, small, simple, and efficient.

SUMMARY

Embodiments of the present disclosure relate to circuitry, which includes a linear amplifier and a linear amplifier power supply. The linear amplifier at least partially provides an envelope power supply signal to a radio frequency (RF) power amplifier (PA) using a selected one of a group of linear amplifier supply voltages. The linear amplifier power supply provides at least one of the group of linear amplifier supply voltages. Selection of the selected one of the group of linear amplifier supply voltages is based on a desired voltage of the envelope power supply signal.

In one embodiment of the circuitry, the RF PA receives and amplifies an RF input signal to provide an RF transmit signal using the envelope power supply signal, which provides power for amplification. In one embodiment of the RF input signal, the RF input signal is amplitude modulated. As such, the RF transmit signal is also amplitude modulated. Since the amplitude of the RF transmit signal is modulated, the amplitude of the RF transmit signal traverses within an envelope of the RF transmit signal. For proper operation of the RF PA, a voltage of the envelope power supply signal must be high enough to accommodate the envelope of the RF transmit signal. However, to increase efficiency in the RF PA, the voltage of the envelope power supply signal may at least partially track the envelope of the RF transmit signal. This tracking by the voltage of the envelope power supply signal is called envelope tracking.

A difference between the selected one of a group of linear amplifier supply voltages and the voltage of the envelope power supply signal is manifested as a voltage drop in the linear amplifier. To increase efficiency in the linear amplifier, the voltage drop in the linear amplifier may be reduced. In this regard, in one embodiment of the linear amplifier power supply, the selection of the selected one of the group of linear amplifier supply voltages is further based on reducing the voltage drop in the linear amplifier.

In one embodiment of the circuitry, a DC power source, such as a battery, provides one of the group of linear amplifier supply voltages and the linear amplifier power supply provides a balance of the group of linear amplifier supply voltages. As such, during envelope tracking, the selected one of the group of linear amplifier supply voltages may toggle between a voltage provided by the DC power source and a voltage provided by the linear amplifier power supply.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 1:
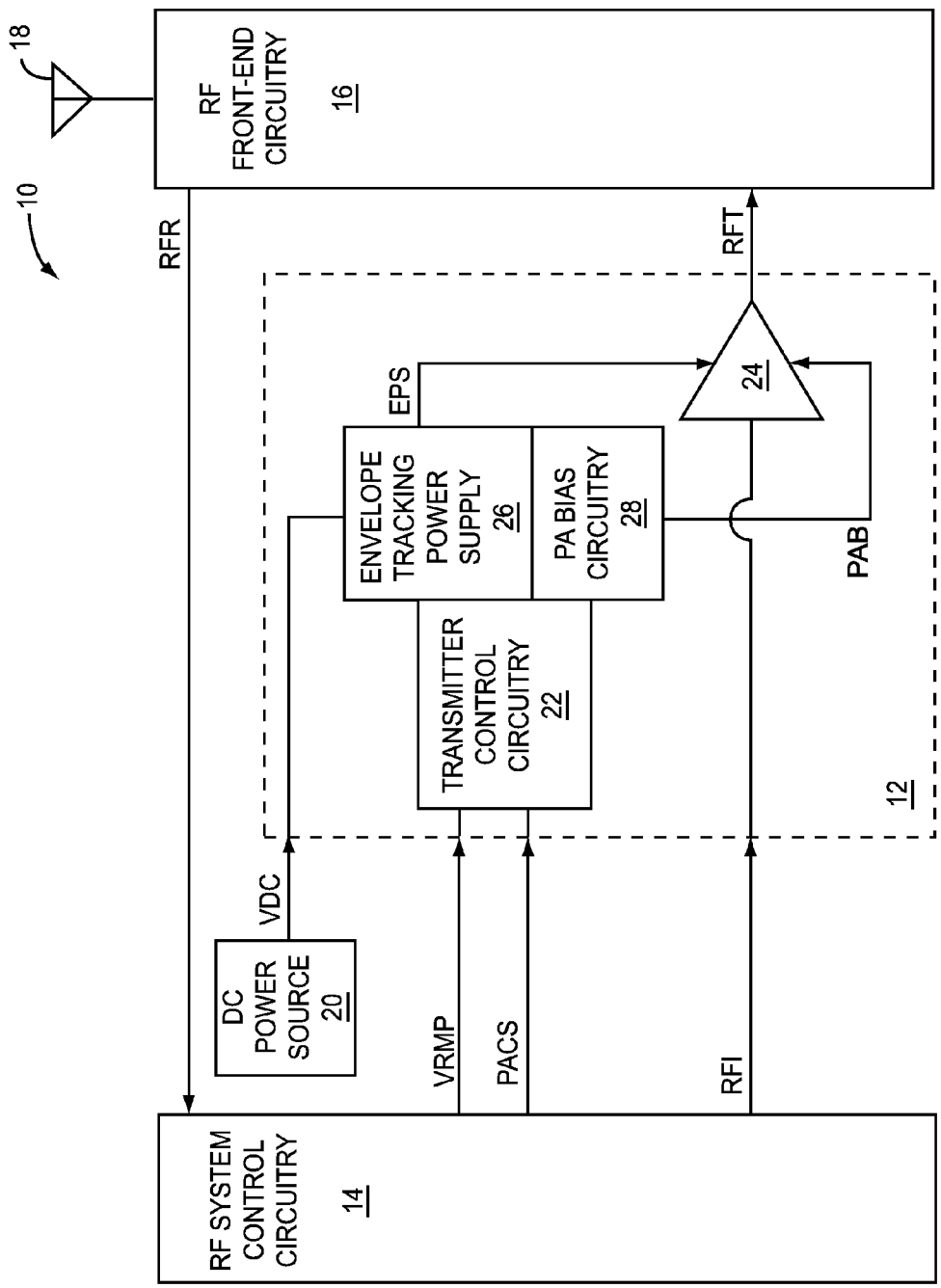
FIG. 1 shows an RF communications system according to one embodiment of the RF communications system.

FIG. 1 shows an RF communications system 10 according to one embodiment of the RF communications system 10. The RF communications system 10 includes RF transmitter circuitry 12, RF system control circuitry 14, RF front-end circuitry 16, an RF antenna 18, and a DC power source 20.

The RF transmitter circuitry 12 includes transmitter control circuitry 22, an RF PA 24, an envelope tracking power supply 26, and PA bias circuitry 28.

In one embodiment of the RF communications system 10, the RF front-end circuitry 16 receives via the RF antenna 18, processes, and forwards an RF receive signal RFR to the RF system control circuitry 14. The RF system control circuitry 14 provides an envelope power supply control signal VRMP and a transmitter configuration signal PACS to the transmitter control circuitry 22. The RF system control circuitry 14 provides an RF input signal RFI to the RF PA 24. The DC power source 20 provides a DC source signal VDC to the envelope tracking power supply 26. In one embodiment of the DC power source 20, the DC power source 20 is a battery.

The transmitter control circuitry 22 is coupled to the envelope tracking power supply 26 and to the PA bias circuitry 28. The envelope tracking power supply 26 provides an envelope power supply signal EPS to the RF PA 24 based on the envelope power supply control signal VRMP. The DC source signal VDC provides power to the envelope tracking power supply 26. As such, the envelope power supply signal EPS is based on the DC source signal VDC. The envelope power supply control signal VRMP is representative of a setpoint of the envelope power supply signal EPS. The RF PA 24 receives and amplifies the RF input signal RFI to provide an RF transmit signal RFT using the envelope power supply signal EPS. The envelope power supply signal EPS provides power for amplification. The RF front-end circuitry 16 receives, processes, and transmits the RF transmit signal RFT via the RF antenna 18. In one embodiment of the RF transmitter circuitry 12, the transmitter control circuitry 22 configures the RF transmitter circuitry 12 based on the transmitter configuration signal PACS.

The PA bias circuitry 28 provides a PA bias signal PAB to the RF PA 24. In this regard, the PA bias circuitry 28 biases the RF PA 24 via the PA bias signal PAB. In one embodiment of the PA bias circuitry 28, the PA bias circuitry 28 biases the RF PA 24 based on the transmitter configuration signal PACS. In one embodiment of the RF front-end circuitry 16, the RF front-end circuitry 16 includes at least one RF switch, at least one RF amplifier, at least one RF filter, at least one RF duplexer, at least one RF diplexer, at least one RF amplifier, the like, or any combination thereof. In one embodiment of the RF system control circuitry 14, the RF system control circuitry 14 is RF transceiver circuitry, which may include an RF transceiver IC, baseband controller circuitry, the like, or any combination thereof.

Figure 2:
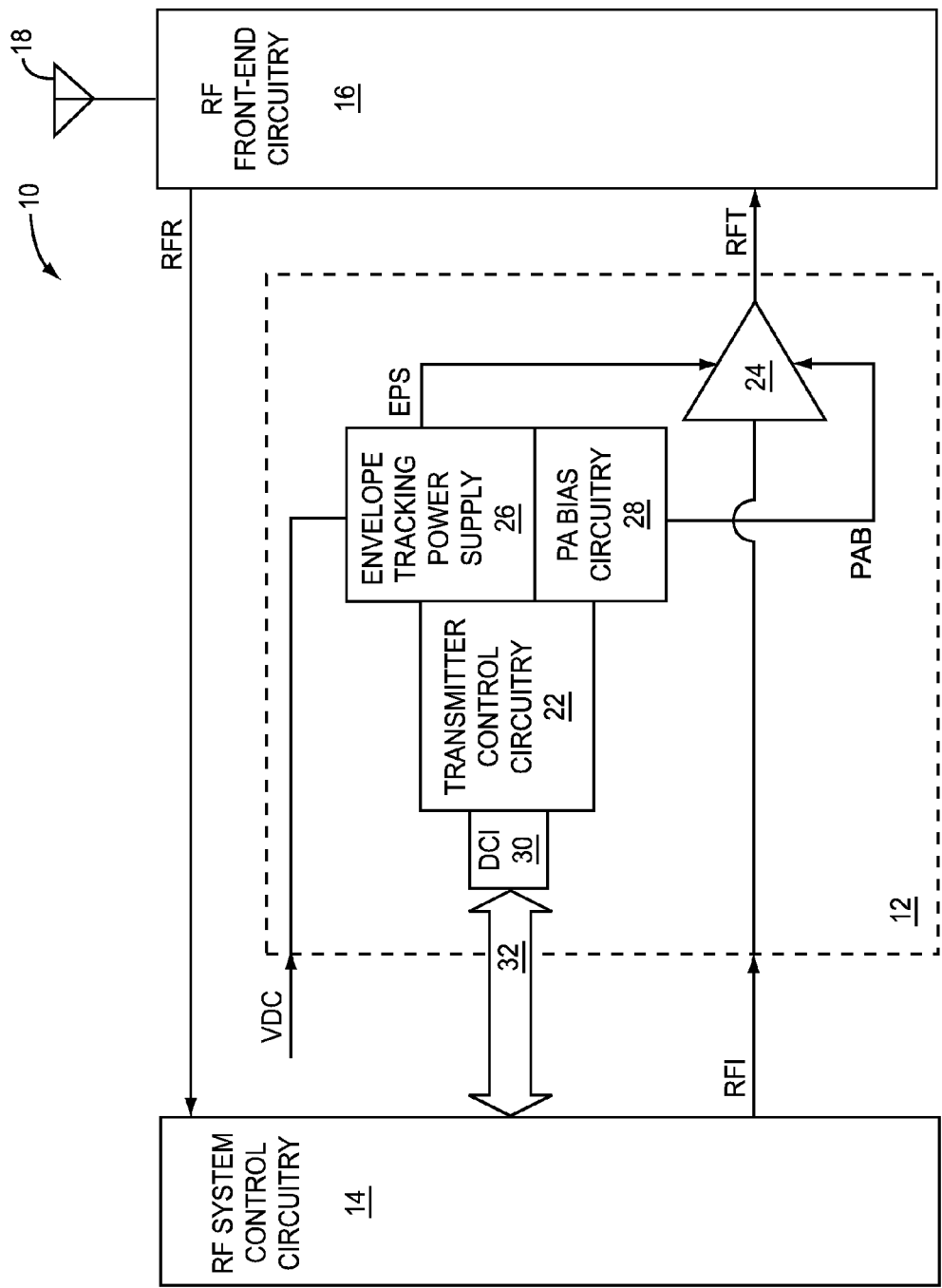
FIG. 2 shows the RF communications system according to an alternate embodiment of the RF communications system.

FIG. 2 shows the RF communications system 10 according to an alternate embodiment of the RF communications system 10. The RF communications system 10 illustrated in FIG. 2 is similar to the RF communications system 10 illustrated in FIG. 1, except in the RF communications system 10 illustrated in FIG. 2, the RF transmitter circuitry 12 further includes a digital communications interface 30, which is coupled between the transmitter control circuitry 22 and a digital communications bus 32. The digital communications bus 32 is also coupled to the RF system control circuitry 14. As such, the RF system control circuitry 14 provides the envelope power supply control signal VRMP (FIG. 1) and the transmitter configuration signal PACS (FIG. 1) to the transmitter control circuitry 22 via the digital communications bus 32 and the digital communications interface 30.

Figure 3:
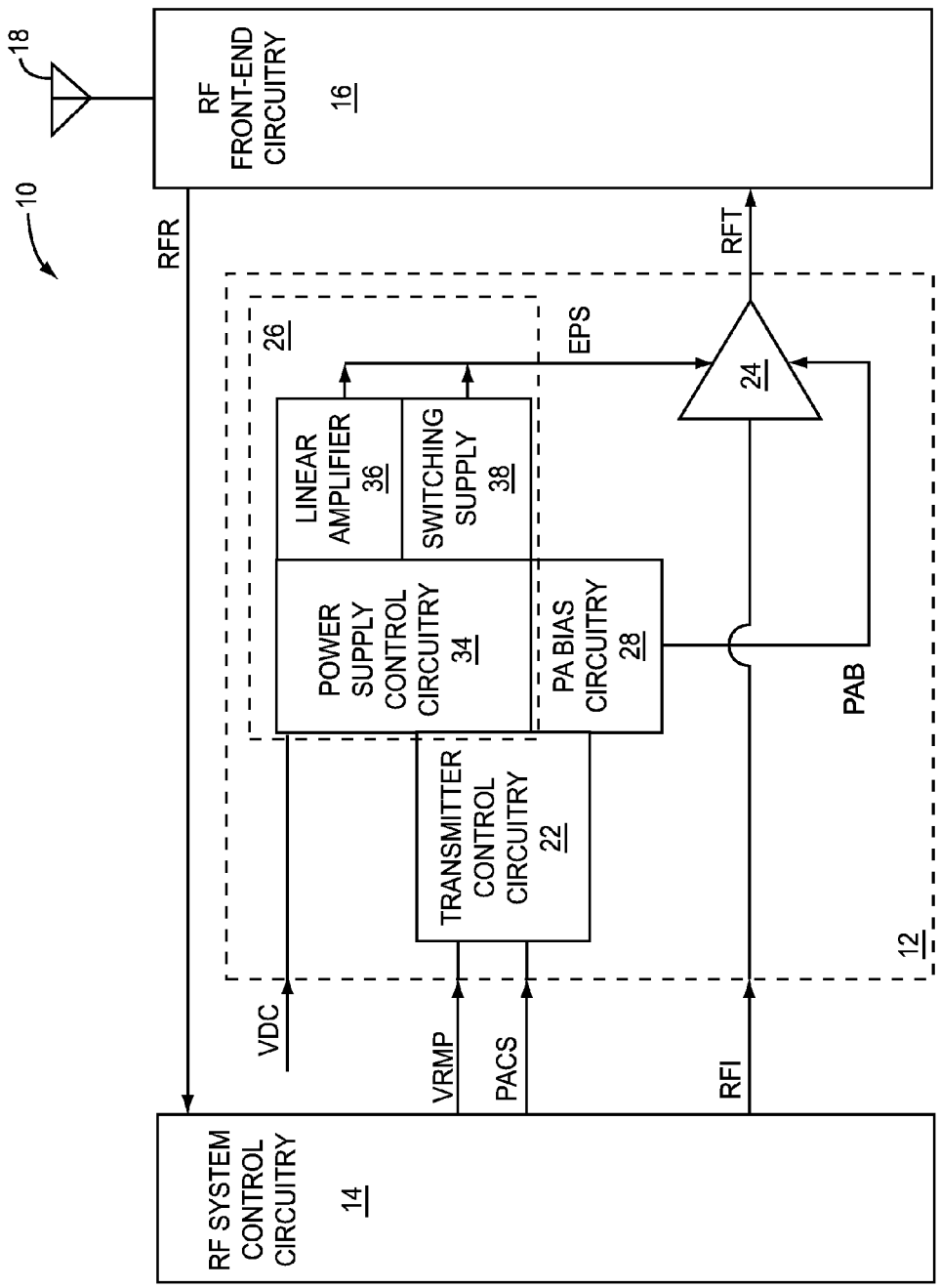
FIG. 3 shows details of an envelope tracking power supply illustrated in FIG. 1 according to one embodiment of the envelope tracking power supply.

FIG. 3 shows details of the envelope tracking power supply 26 illustrated in FIG. 1 according to one embodiment of the envelope tracking power supply 26. The envelope tracking power supply 26 includes power supply control circuitry 34, a linear amplifier 36, and a switching supply 38. The power supply control circuitry 34 is coupled to the transmitter control circuitry 22, the linear amplifier 36 is coupled to the power supply control circuitry 34, and the switching supply 38 is coupled to the power supply control circuitry 34. The transmitter control circuitry 22 may forward the envelope power supply control signal VRMP to the power supply control circuitry 34.

Since the envelope power supply control signal VRMP is representative of the setpoint of the envelope power supply signal EPS, the power supply control circuitry 34 controls the linear amplifier 36 and the switching supply 38 based on the setpoint of the envelope power supply signal EPS. The linear amplifier 36 and the switching supply 38 provide the envelope power supply signal EPS, such that the linear amplifier 36 partially provides the envelope power supply signal EPS and the switching supply 38 partially provides the envelope power supply signal EPS. The switching supply 38 may provide power more efficiently than the linear amplifier 36. However, the linear amplifier 36 may provide the envelope power supply signal EPS more accurately than the switching supply 38. As such, the linear amplifier 36 regulates a voltage of the envelope power supply signal EPS based on the setpoint of the envelope power supply signal EPS, and the switching supply 38 operates to drive an output current from the linear amplifier 36 toward zero to maximize efficiency. In this regard, the linear amplifier 36 behaves like a voltage source and the switching supply 38 behaves like a current source.

As previously mentioned, in one embodiment of the RF communications system 10, the RF PA 24 receives and amplifies the RF input signal RFI to provide the RF transmit signal RFT using the envelope power supply signal EPS, which provides power for amplification. In one embodiment of the RF input signal RFI, the RF input signal RFI is amplitude modulated. As such, the RF transmit signal RFT is also amplitude modulated. Since the amplitude of the RF transmit signal RFT is modulated, the amplitude of the RF transmit signal RFT traverses within an envelope of the RF transmit signal RFT. For proper operation of the RF PA 24, a voltage of the envelope power supply signal EPS must be high enough to accommodate the envelope of the RF transmit signal RFT. However, to increase efficiency in the RF PA 24, the voltage of the envelope power supply signal EPS may at least partially track the envelope of the RF transmit signal RFT. This tracking by the voltage of the envelope power supply signal EPS is called envelope tracking.

In this regard, since the envelope power supply control signal VRMP is representative of the setpoint of the envelope power supply signal EPS, the envelope power supply control signal VRMP may be received and amplitude modulated to provide at least partial envelope tracking of the RF transmit signal RFT by causing the envelope power supply signal EPS to be amplitude modulated. In one embodiment of the envelope power supply control signal VRMP, a bandwidth of the envelope power supply control signal VRMP is greater than about 10 megahertz. In an alternate embodiment of the envelope power supply control signal VRMP, the bandwidth of the envelope power supply control signal VRMP is less than about 10 megahertz.

Figure 4:
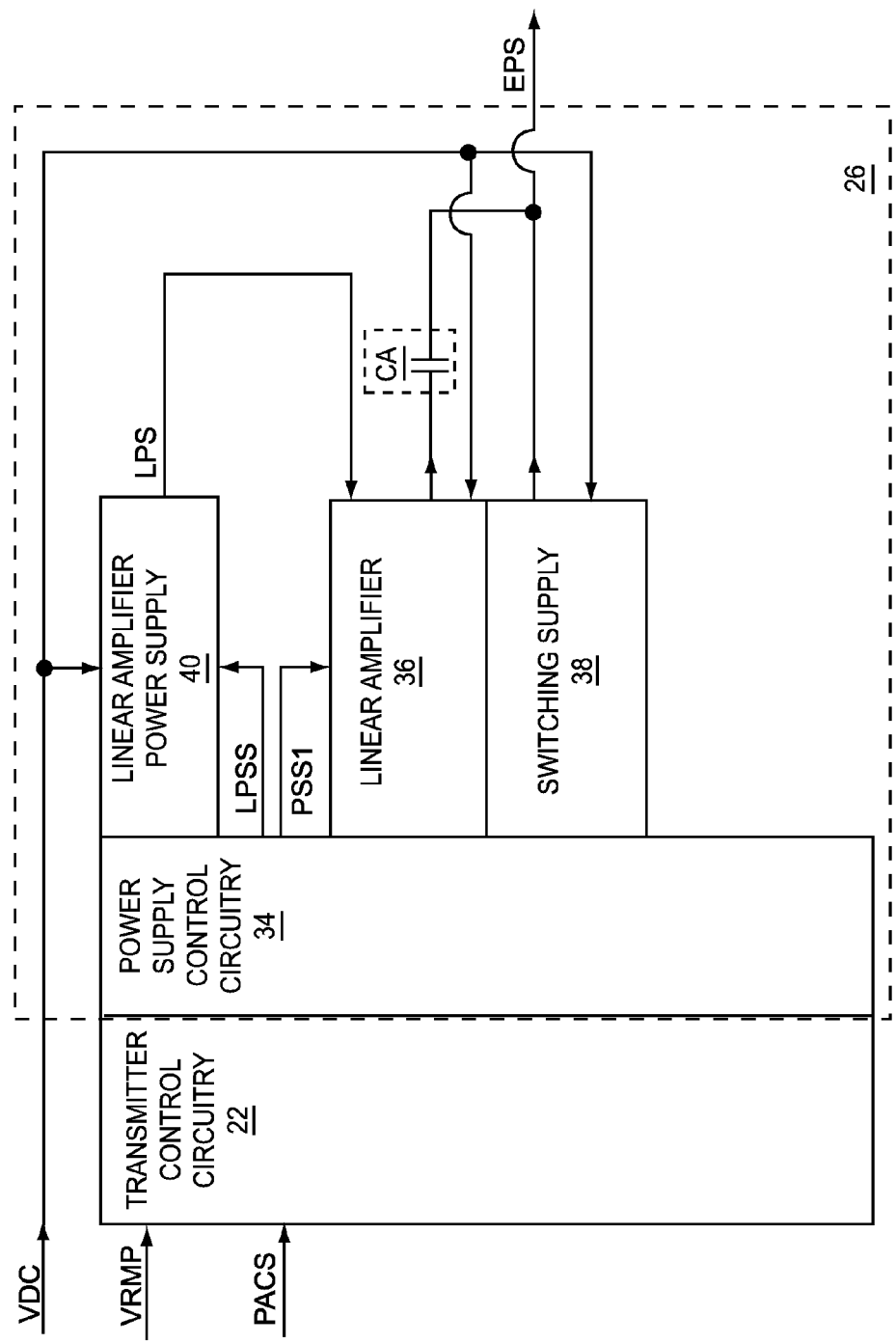
FIG. 4 shows details of the envelope tracking power supply illustrated in FIG. 1 according to an alternate embodiment of the envelope tracking power supply.

FIG. 4 shows details of the envelope tracking power supply 26 illustrated in FIG. 1 according to an alternate embodiment of the envelope tracking power supply 26. The envelope tracking power supply 26 illustrated in FIG. 4 is similar to the envelope tracking power supply 26 illustrated in FIG. 3, except the envelope tracking power supply 26 illustrated in FIG. 4 further includes a linear amplifier power supply 40 and a linear amplifier offset capacitive element CA. The linear amplifier power supply 40 is coupled to the power supply control circuitry 34 and to the switching supply 38, and the linear amplifier offset capacitive element CA is coupled between the linear amplifier 36 and the switching supply 38. As such, a series combination of the linear amplifier 36 and the linear amplifier offset capacitive element CA at least partially provides the envelope power supply signal EPS and the switching supply 38 at least partially provides the envelope power supply signal EPS directly.

The linear amplifier 36, the switching supply 38, and the linear amplifier power supply 40 receive the DC source signal VDC. The power supply control circuitry 34 provides a linear amplifier power supply select signal LPSS to the linear amplifier power supply 40 and provides a first power source select signal PSS1 to the linear amplifier 36. The linear amplifier power supply 40 provides a linear amplifier power supply output signal LPS to the linear amplifier 36.

The linear amplifier 36 at least partially provides the envelope power supply signal EPS to the RF PA 24 (FIG. 3) using a selected one of a group of linear amplifier supply voltages. The linear amplifier power supply 40 provides at least one of the group of linear amplifier supply voltages. Selection of the selected one of the group of linear amplifier supply voltages is based on a desired voltage of the envelope power supply signal EPS. The setpoint of the envelope power supply signal EPS is based on the desired voltage of the envelope power supply signal EPS. As such, the linear amplifier 36 regulates a voltage of the envelope power supply signal EPS based on the setpoint of the envelope power supply signal EPS.

A difference between the selected one of the group of linear amplifier supply voltages and the voltage of the envelope power supply signal EPS is manifested as a voltage drop in the linear amplifier 36. To increase efficiency in the linear amplifier 36, the voltage drop in the linear amplifier 36 may be reduced. In this regard, in one embodiment of the linear amplifier power supply 40, the selection of the selected one of the group of linear amplifier supply voltages is further based on reducing the voltage drop in the linear amplifier 36. However, the selected one of the group of linear amplifier supply voltages must provide a large enough voltage of the envelope power supply signal EPS to ensure that the linear amplifier 36 has sufficient operating headroom to function properly.

In one embodiment of the envelope tracking power supply 26, the DC power source 20 (FIG. 1) provides one of the group of linear amplifier supply voltages and the linear amplifier power supply 40 provides a balance of the group of linear amplifier supply voltages. In this regard, the linear amplifier 36 receives the DC source signal VDC and the linear amplifier power supply output signal LPS, such that the one of the group of linear amplifier supply voltages is provided via the DC source signal VDC and the balance of the group of linear amplifier supply voltages is provided via the linear amplifier power supply output signal LPS. Further, the linear amplifier 36 receives the first power source select signal PSS1, such that selection between using the one of the group of linear amplifier supply voltages and using the balance of the group of linear amplifier supply voltages is based on the first power source select signal PSS1.

The power supply control circuitry 34 selects one of the balance of the group of linear amplifier supply voltages and provides a linear amplifier power supply select signal LPSS to the linear amplifier power supply 40, such that the linear amplifier power supply select signal LPSS is indicative of the selection of the one of the balance of the group of linear amplifier supply voltages. The linear amplifier 36 receives the linear amplifier power supply select signal LPSS and provides the one of the balance of the group of linear amplifier supply voltages via the linear amplifier power supply output signal LPS based on the linear amplifier power supply select signal LPSS. Further, the power supply control circuitry 34 provides the first power source select signal PSS1 and the linear amplifier power supply select signal LPSS, such that the first power source select signal PSS1 and the linear amplifier power supply select signal LPSS are based on the envelope power supply control signal VRMP. The first power source select signal PSS1 may be delayed relative to receipt of the envelope power supply control signal VRMP to compensate for processing delays of the envelope power supply control signal VRMP.

In one embodiment of the linear amplifier power supply 40, during envelope tracking, the linear amplifier power supply 40 cannot change the linear amplifier power supply output signal LPS fast enough to follow the envelope of the envelope power supply signal EPS. Therefore, the selected one of the group of linear amplifier supply voltages may toggle between the voltage provided by the DC power source 20 (FIG. 1) and the voltage provided by the linear amplifier power supply 40. In this regard, the linear amplifier 36 toggles between using the DC source signal VDC and the linear amplifier power supply output signal LPS to at least partially provide the envelope power supply signal EPS. As such, the linear amplifier power supply output signal LPS may be based on a maximum amplitude of the envelope power supply signal EPS. Further, the toggling between using the DC source signal VDC and the linear amplifier power supply output signal LPS may be based on a programmable threshold associated with the envelope power supply signal EPS.

During operation, the linear amplifier offset capacitive element CA may have an offset voltage. This offset voltage may allow the linear amplifier 36 to function properly even if a voltage of the envelope power supply signal EPS is greater than a voltage of the DC source signal VDC or greater than a voltage of the linear amplifier power supply output signal LPS. In an alternate embodiment of the envelope tracking power supply 26, the linear amplifier offset capacitive element CA is omitted. In one embodiment of the envelope tracking power supply 26, the switching supply 34 operates to drive an output current from the linear amplifier 36 toward zero to maximize efficiency.

Figure 5:
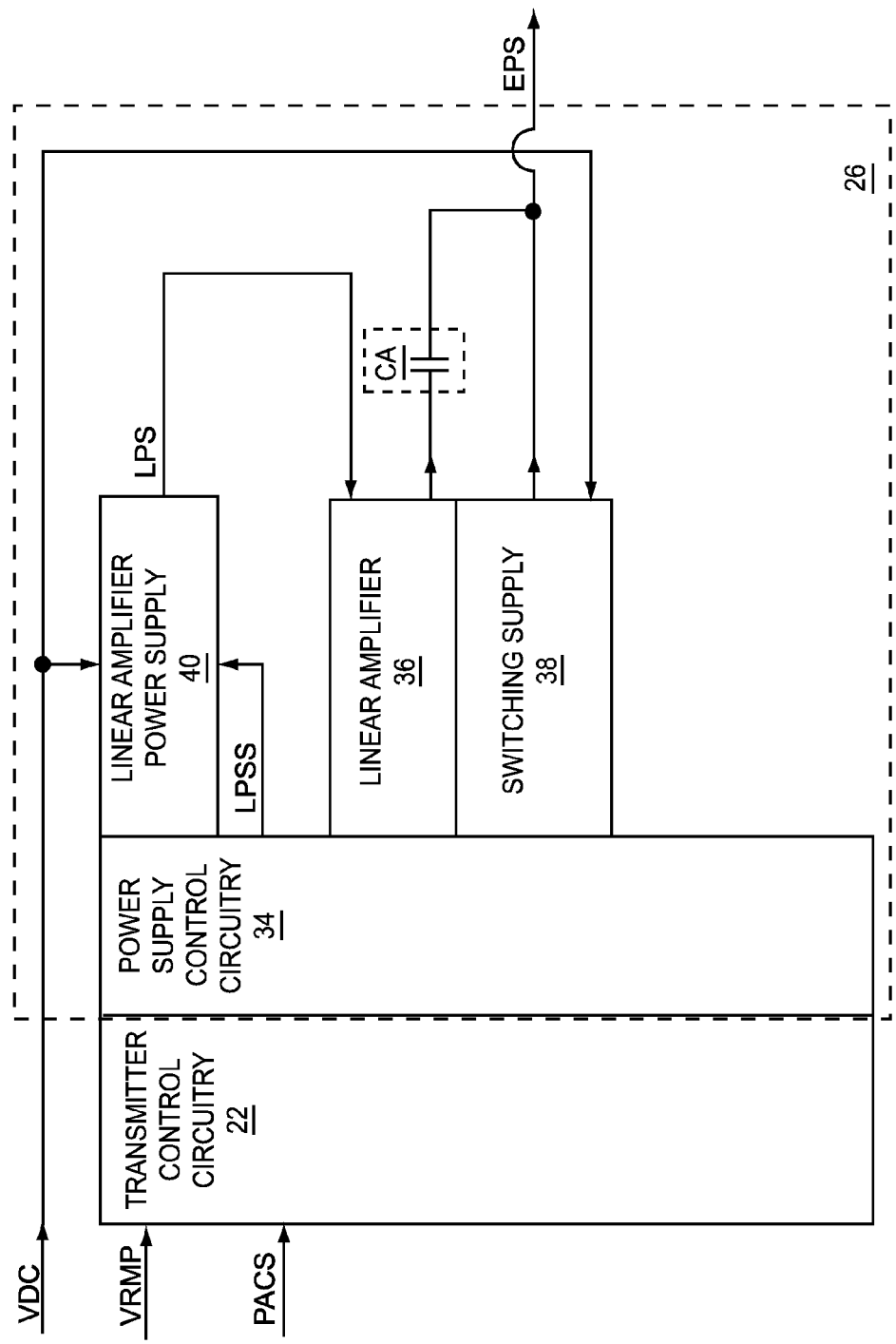
FIG. 5 shows details of the envelope tracking power supply illustrated in FIG. 1 according to an additional embodiment of the envelope tracking power supply.

FIG. 5 shows details of the envelope tracking power supply 26 illustrated in FIG. 1 according to an additional embodiment of the envelope tracking power supply 26. The envelope tracking power supply 26 illustrated in FIG. 5 is similar to the envelope tracking power supply 26 illustrated in FIG. 4, except in the envelope tracking power supply 26 illustrated in FIG. 5, the linear amplifier 36 does not receive the first power source select signal PSS1 or the DC source signal VDC. As result, the linear amplifier power supply 40 provides the entire group of linear amplifier supply voltages. Therefore, during envelope tracking, the linear amplifier power supply 40 can change the linear amplifier power supply output signal LPS fast enough to adequately follow the envelope of the envelope power supply signal EPS.

Figure 6:
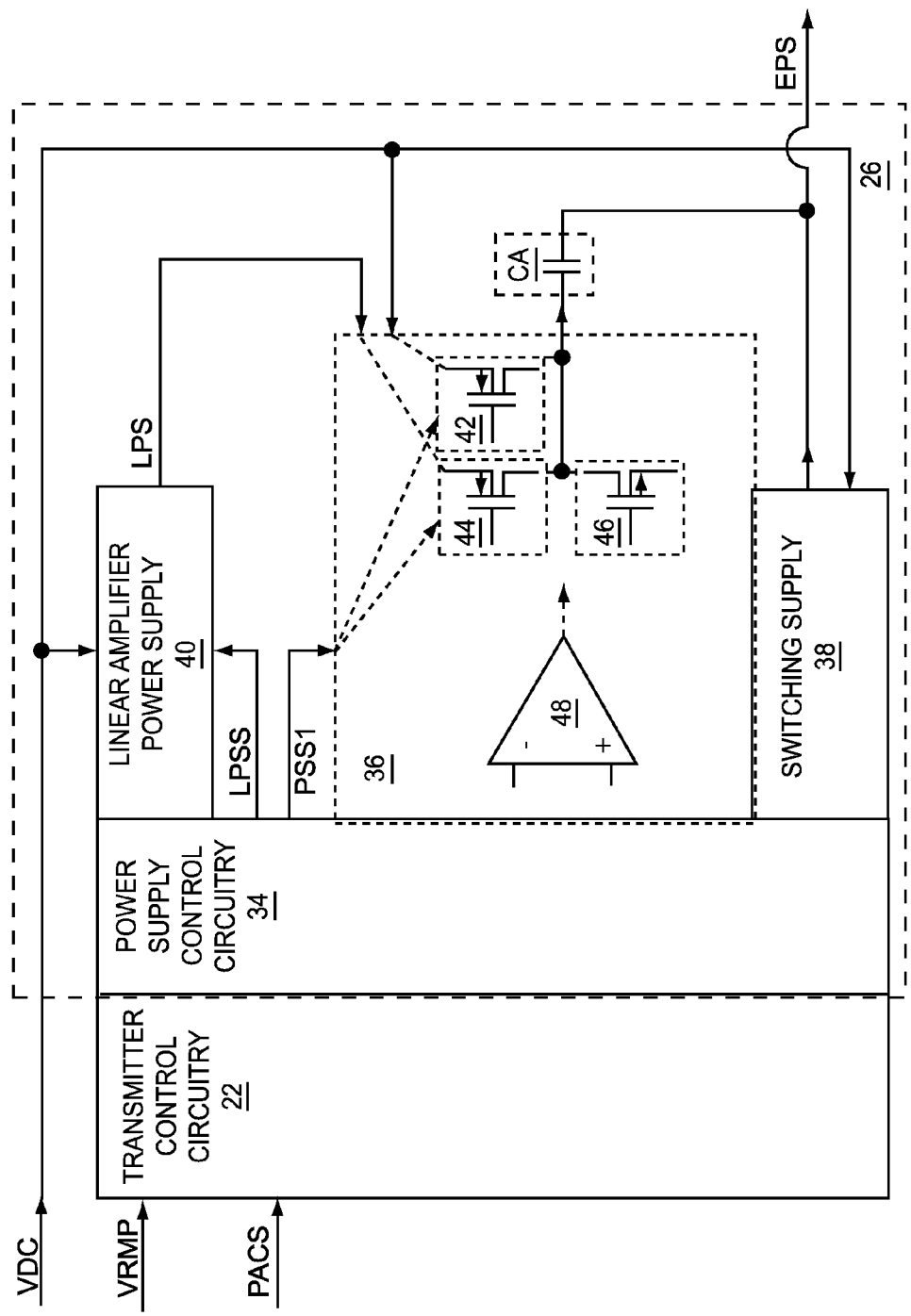
FIG. 6 shows details of the envelope tracking power supply illustrated in FIG. 1 according to another embodiment of the envelope tracking power supply.

FIG. 6 shows details of the envelope tracking power supply 26 illustrated in FIG. 1 according to another embodiment of the envelope tracking power supply 26. The envelope tracking power supply 26 illustrated in FIG. 6 is similar to the envelope tracking power supply 26 illustrated in FIG. 4, except the envelope tracking power supply 26 illustrated in FIG. 6 shows details of the linear amplifier 36. The linear amplifier 36 includes first P-type field effect transistor (PFET) circuitry 42, second PFET circuitry 44, N-type field effect transistor (NFET) circuitry 46, and a driver circuit 48. The driver circuit 48 feeds the first PFET circuitry 42, the second PFET circuitry 44, and the NFET circuitry 46. One of the first PFET circuitry 42 and the second PFET circuitry 44 is enabled based on the first power source select signal PSS1. The one of the first PFET circuitry 42, the second PFET circuitry 44 that is enabled and the NFET circuitry 46 form a final output stage that provides at least a portion of the envelope power supply signal EPS via the linear amplifier offset capacitive element CA.

The first PFET circuitry 42 receives the DC source signal VDC and the second PFET circuitry 44 receives the linear amplifier power supply output signal LPS. As such, when the first PFET circuitry 42 is enabled, the DC source signal VDC provides power to the final output stage. When the second PFET circuitry 44 is enabled, the linear amplifier power supply output signal LPS provides power to the final output stage. In one embodiment of the first power source select signal PSS1, the first power source select signal PSS1 is a two-bit signal, such that each of the first PFET circuitry 42 and the second PFET circuitry 44 receives a corresponding bit for selection.

In one embodiment of the linear amplifier 36, when the linear amplifier 36 transitions between disabling the first PFET circuitry 42 and enabling the second PFET circuitry 44 or transitions between disabling the second PFET circuitry 44 and enabling the first PFET circuitry 42, such transitioning is delayed until the NFET circuitry 46 is in an ON state. In general, one of the first PFET circuitry 42 and the second PFET circuitry 44 is enabled. The linear amplifier 36 disables the one of the first PFET circuitry 42 and the second PFET circuitry 44 and enables an opposite of the first PFET circuitry 42 and the second PFET circuitry 44 when the NFET circuitry 46 is in an ON state, such that both the first PFET circuitry 42 and the second PFET circuitry 44 are in an OFF state.

Figure 7:
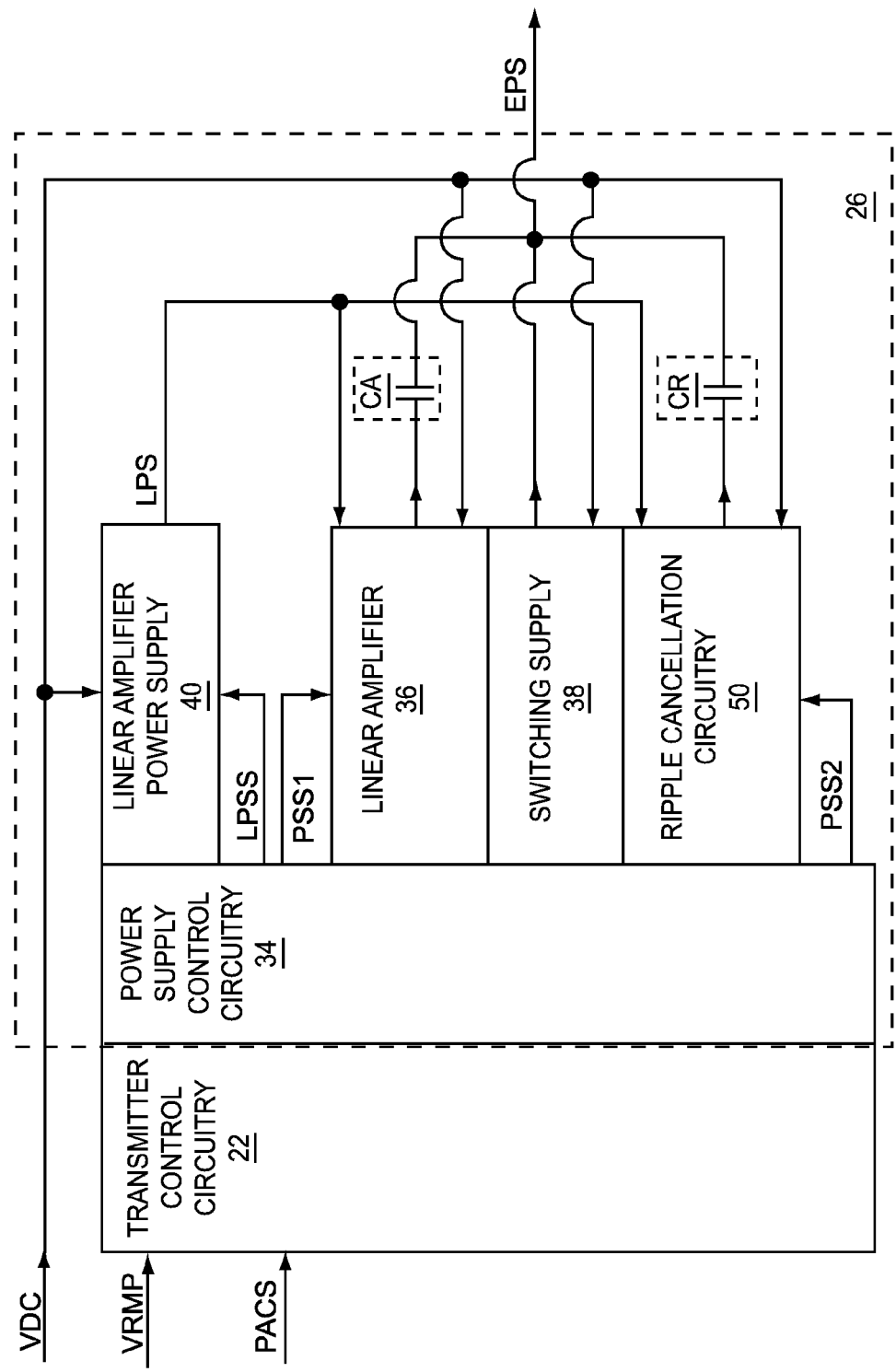
FIG. 7 shows details of the envelope tracking power supply illustrated in FIG. 1 according to a further embodiment of the envelope tracking power supply.

FIG. 7 shows details of the envelope tracking power supply 26 illustrated in FIG. 1 according to a further embodiment of the envelope tracking power supply 26. The envelope tracking power supply 26 illustrated in FIG. 7 is similar to the envelope tracking power supply 26 illustrated in FIG. 4, except the envelope tracking power supply 26 illustrated in FIG. 7 further includes ripple cancellation circuitry 50 and a ripple circuit offset capacitive element CR. The ripple cancellation circuitry 50 is coupled to the power supply control circuitry 34 and to the switching supply 38, and the ripple circuit offset capacitive element CR is coupled between the ripple cancellation circuitry 50 and the switching supply 38.

The ripple cancellation circuitry 50 receives the DC source signal VDC. The power supply control circuitry 34 provides a second power source select signal PSS2 to the ripple cancellation circuitry 50. The linear amplifier power supply 40 provides the linear amplifier power supply output signal LPS to the ripple cancellation circuitry 50. The ripple cancellation circuitry 50 at least partially cancels ripple current associated with at least one inductive element (not shown) in the switching supply 38 using one of the DC source signal VDC and the linear amplifier power supply output signal LPS. The ripple cancellation circuitry 50 receives the second power source select signal PSS2, such that selection between using the one of the DC source signal VDC and the linear amplifier power supply output signal LPS is based on the second power source select signal PSS2. The second power source select signal PSS2 may be based on a maximum amplitude of the envelope power supply signal EPS.

During operation, the ripple circuit offset capacitive element CR may have an offset voltage. This offset voltage may allow the ripple cancellation circuitry 50 to function properly even if a voltage of the envelope power supply signal EPS is greater than a voltage of the DC source signal VDC or greater than a voltage of the linear amplifier power supply output signal LPS. In an alternate embodiment of the envelope tracking power supply 26, the ripple circuit offset capacitive element CR is omitted.

In one embodiment of the envelope tracking power supply 26, the switching supply 38 operates to drive an output current from the ripple cancellation circuitry 50 toward zero to maximize efficiency. In an alternate embodiment of the envelope tracking power supply 26, the switching supply 38 operates to drive the output current from the linear amplifier 36 toward zero and to drive the output current from the ripple cancellation circuitry 50 toward zero to maximize efficiency.

Figure 8:
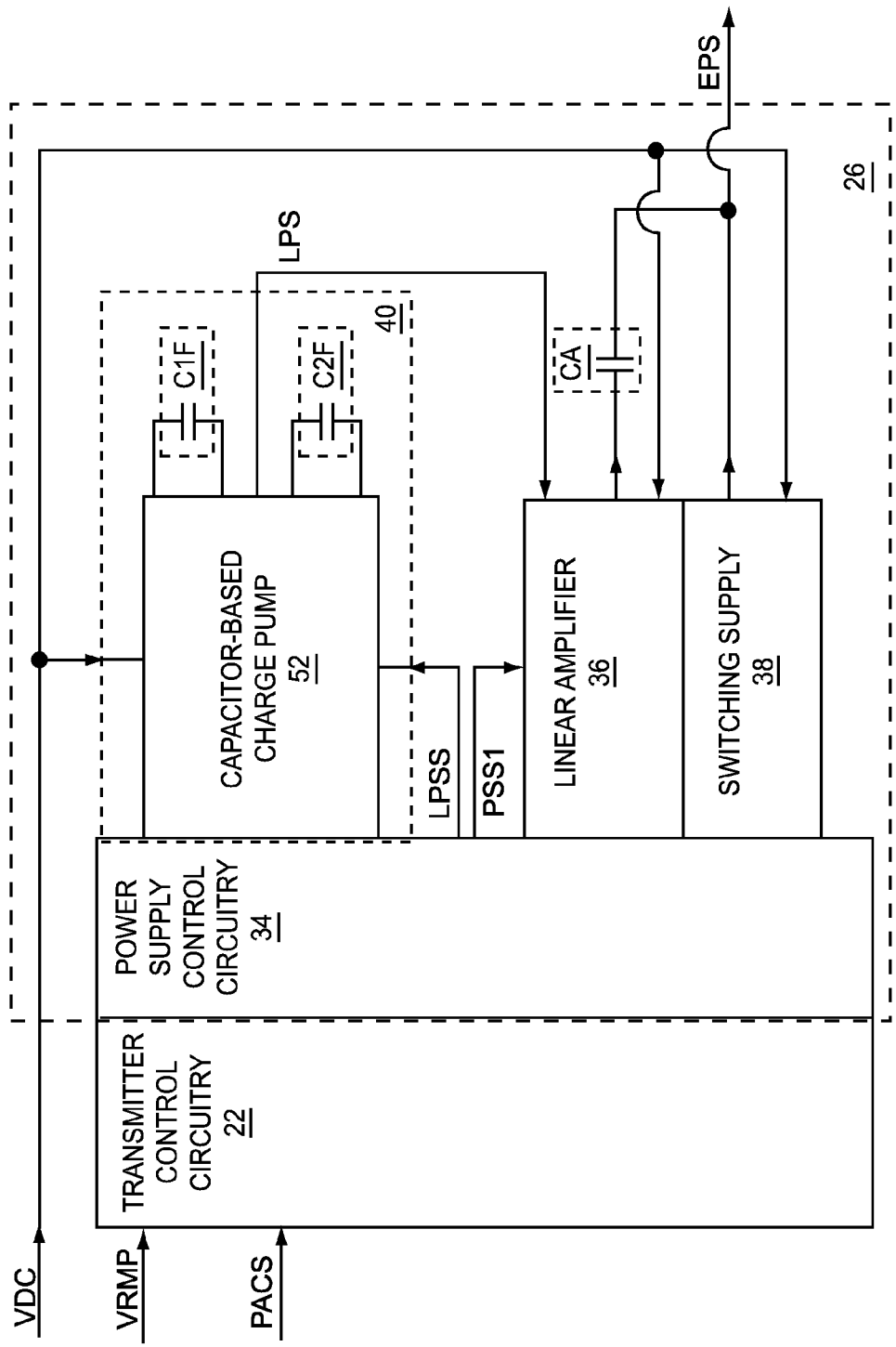
FIG. 8 shows details of the envelope tracking power supply illustrated in FIG. 1 according to a supplemental embodiment of the envelope tracking power supply.

FIG. 8 shows details of the envelope tracking power supply 26 illustrated in FIG. 1 according to a supplemental embodiment of the envelope tracking power supply 26. The envelope tracking power supply 26 illustrated in FIG. 8 is similar to the envelope tracking power supply 26 illustrated in FIG. 4, except the envelope tracking power supply 26 illustrated in FIG. 8 shows details of the linear amplifier power supply 40. The linear amplifier power supply 40 includes a capacitor-based charge pump 52, a first flying capacitive element C1F, and a second flying capacitive element C2F. The first flying capacitive element C1F and the second flying capacitive element C2F are coupled to the capacitor-based charge pump 50. In general, the first flying capacitive element C1F and the second flying capacitive element C2F provide a pair of flying capacitive elements, which are coupled to the capacitor-based charge pump 52. The capacitor-based charge pump 52 transfers charge from the DC power source 20 (FIG. 1) to the linear amplifier 36 using the pair of flying capacitive elements. In an alternate embodiment of the envelope tracking power supply 26, the capacitor-based charge pump 52 further transfers charge from the DC power source 20 (FIG. 1) to the ripple cancellation circuitry 50 (FIG. 7).

The DC power source 20 (FIG. 1) provides power to the capacitor-based charge pump 52 via the DC source signal VDC. As such, the capacitor-based charge pump 52 receives the DC source signal VDC and provides the linear amplifier power supply output signal LPS based on the DC source signal VDC. In this regard, a voltage magnitude of the linear amplifier power supply output signal LPS may be greater than, less than, or equal to the voltage magnitude of the DC source signal VDC.

In one embodiment of the capacitor-based charge pump 52, the voltage magnitude of the DC source signal VDC is always less than the voltage magnitude of the linear amplifier power supply output signal LPS. As such, the one of the group of linear amplifier supply voltages is less than each of the balance of the group of linear amplifier supply voltages. In an alternate embodiment of the capacitor-based charge pump 52, the voltage magnitude of the DC source signal VDC is always greater than the voltage magnitude of the linear amplifier power supply output signal LPS. As such, the one of the group of linear amplifier supply voltages is greater than each of the balance of the group of linear amplifier supply voltages. In an additional embodiment of the capacitor-based charge pump 52, the voltage magnitude of the DC source signal VDC is sometimes less than the voltage magnitude of the linear amplifier power supply output signal LPS and is sometimes greater than the voltage magnitude of the linear amplifier power supply output signal LPS. As such, the one of the group of linear amplifier supply voltages is less than at least one of the balance of the group of linear amplifier supply voltages and is greater than at least one of the balance of the group of linear amplifier supply voltages. In another embodiment of the capacitor-based charge pump 52, the voltage magnitude of the DC source signal VDC is about equal to the voltage magnitude of the linear amplifier power supply output signal LPS In a first exemplary embodiment of the capacitor-based charge pump 52, a ratio of a voltage magnitude of the linear amplifier power supply output signal LPS divided by a voltage magnitude of the DC source signal VDC is equal to about one.

In a second exemplary embodiment of the capacitor-based charge pump 52, the ratio of the voltage magnitude of the linear amplifier power supply output signal LPS divided by the voltage magnitude of the DC source signal VDC is equal to about four-thirds.

In a third exemplary embodiment of the capacitor-based charge pump 52, the ratio of the voltage magnitude of the linear amplifier power supply output signal LPS divided by the voltage magnitude of the DC source signal VDC is equal to about three-halves.

In a fourth exemplary embodiment of the capacitor-based charge pump 52, the ratio of the voltage magnitude of the linear amplifier power supply output signal LPS divided by the voltage magnitude of the DC source signal VDC is equal to about one-fourth.

In a fifth exemplary embodiment of the capacitor-based charge pump 52, the ratio of the voltage magnitude of the linear amplifier power supply output signal LPS divided by the voltage magnitude of the DC source signal VDC is equal to about one-third.

In a sixth exemplary embodiment of the capacitor-based charge pump 52, the ratio of the voltage magnitude of the linear amplifier power supply output signal LPS divided by the voltage magnitude of the DC source signal VDC is equal to about one-half.

In a seventh exemplary embodiment of the capacitor-based charge pump 52, the ratio of the voltage magnitude of the linear amplifier power supply output signal LPS divided by the voltage magnitude of the DC source signal VDC is equal to about two-thirds.

In an eighth exemplary embodiment of the capacitor-based charge pump 52, the ratio of the voltage magnitude of the linear amplifier power supply output signal LPS divided by the voltage magnitude of the DC source signal VDC is equal to about three-fourths.

Figure 9:
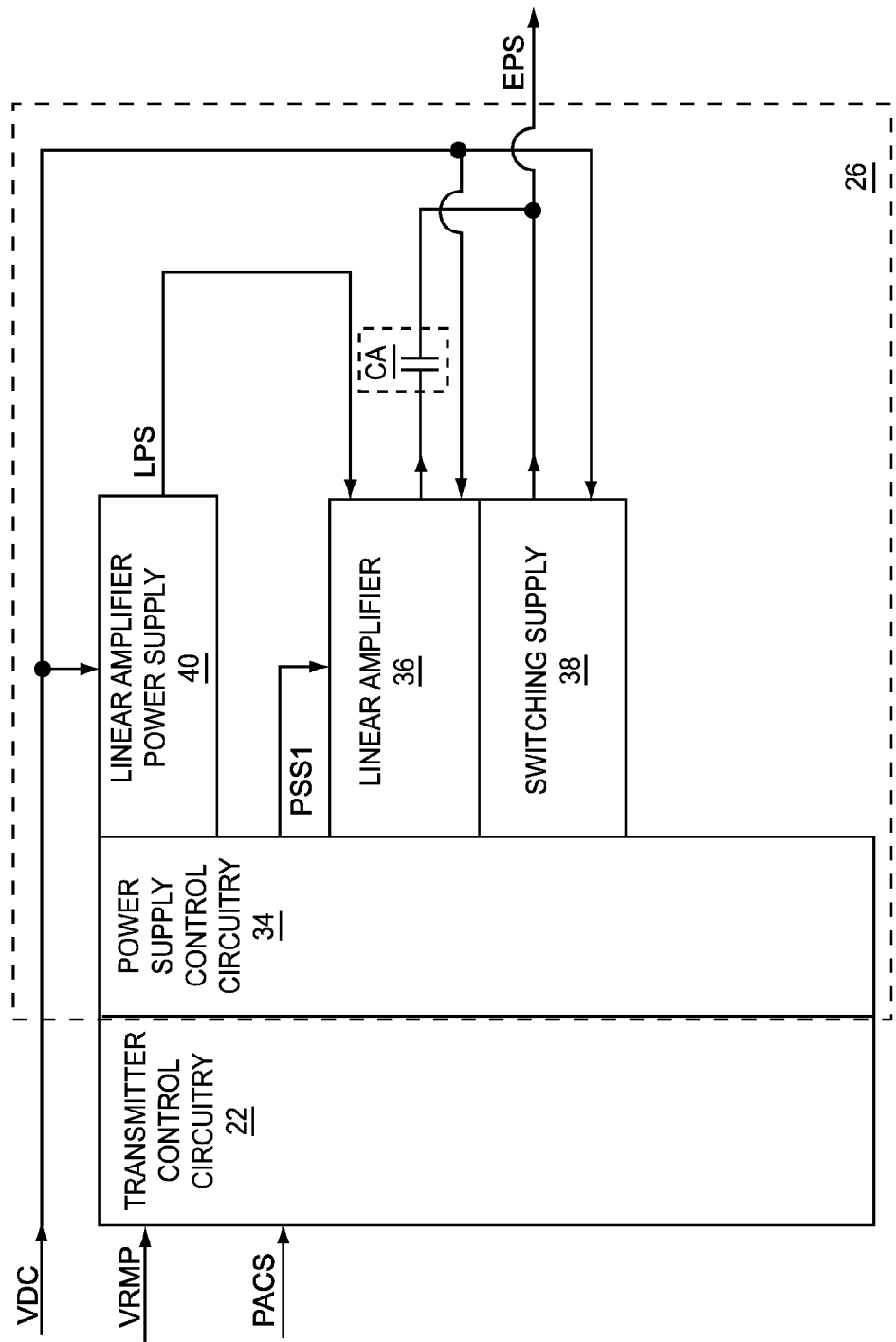
FIG. 9 shows details of the envelope tracking power supply illustrated in FIG. 1 according to an extra embodiment of the envelope tracking power supply.

FIG. 9 shows details of the envelope tracking power supply 26 illustrated in FIG. 1 according to an extra embodiment of the envelope tracking power supply 26. The envelope tracking power supply 26 illustrated in FIG. 9 is similar to the envelope tracking power supply 26 illustrated in FIG. 4, except in the envelope tracking power supply 26 illustrated in FIG. 9, the linear amplifier power supply select signal LPSS is omitted. As such, the linear amplifier power supply 40 provides a single linear amplifier supply voltage, such that the balance of the group of linear amplifier supply voltages is one linear amplifier supply voltage.

Those skilled in the art will recognize improvements and modifications to the embodiments of the present disclosure. All such improvements and modifications are considered within the scope of the concepts disclosed herein and the claims that follow.

What is claimed is:

1. Circuitry comprising:
a linear amplifier adapted to at least partially provide an envelope power supply signal to a radio frequency (RF) power amplifier (PA) using a selected one of a plurality of linear amplifier supply voltages;
power supply control circuitry adapted to select one of the plurality of linear amplifier supply voltages based on a desired voltage of the envelope power supply signal;
a linear amplifier power supply adapted to provide at least one of the plurality of linear amplifier supply voltages;
a setpoint of the envelope power supply signal is based on the desired voltage of the envelope power supply signal; and
an envelope power supply control signal is representative of the setpoint of the envelope power supply signal.

2. The circuitry of claim 1 wherein the linear amplifier is further adapted to regulate a voltage of the envelope power supply signal based on the setpoint of the envelope power supply signal.

3. The circuitry of claim 1 wherein the envelope power supply control signal is amplitude modulated to provide at least partial envelope tracking of an RF transmit signal.

4. The circuitry of claim 3 wherein the RF PA is adapted to receive and amplify an RF input signal to provide the RF transmit signal using the envelope power supply signal, which provides power for amplification.

5. The circuitry of claim 4 further comprising the RF PA.

6. The circuitry of claim 3 wherein a bandwidth of the envelope power supply control signal is greater than about 10 megahertz.

7. Circuitry comprising:
a linear amplifier adapted to at least partially provide an envelope power supply signal to a radio frequency (RF) power amplifier (PA) using a selected one of a plurality of linear amplifier supply voltages;
power supply control circuitry adapted to select one of the plurality of linear amplifier supply voltages based on a desired voltage of the envelope power supply signal;
a linear amplifier power supply adapted to provide at least one of the plurality of linear amplifier supply voltages; and
the linear amplifier is further adapted to receive a direct current (DC) source signal and a linear amplifier power supply output signal, such that one of the plurality of linear amplifier supply voltages is provided via the DC source signal and a balance of the plurality of linear amplifier supply voltages is provided via the linear amplifier power supply output signal.

8. The circuitry of claim 7 wherein the balance of the plurality of linear amplifier supply voltages is one linear amplifier supply voltage.

9. The circuitry of claim 7 wherein a DC power source is adapted to provide the DC source signal.

10. The circuitry of claim 9 wherein the DC power source is a battery.

11. The circuitry of claim 7 wherein the linear amplifier is further adapted to receive a first power source select signal, such that selection between using the one of the plurality of linear amplifier supply voltages and using the balance of the plurality of linear amplifier supply voltages is based on the first power source select signal.

12. The circuitry of claim 11 wherein the linear amplifier comprises first P-type field effect transistor (PFET) circuitry and second PFET circuitry, such that one of the first PFET circuitry and the second PFET circuitry is enabled based on the first power source select signal.

13. The circuitry of claim 12 wherein the first power source select signal is a two-bit signal.

14. The circuitry of claim 12 wherein the linear amplifier further comprises N-type field effect transistor (NFET) circuitry and is further adapted to disable the one of the first PFET circuitry and the second PFET circuitry and to enable an opposite of the first PFET circuitry and the second PFET circuitry only when the NFET circuitry is in an ON state, such that both the first PFET circuitry and the second PFET circuitry are in an OFF state.

15. The circuitry of claim 11 wherein the linear amplifier power supply is further adapted to receive a linear amplifier power supply select signal and to provide one of the balance of the plurality of linear amplifier supply voltages based on the linear amplifier power supply select signal.

16. The circuitry of claim 15 wherein the power supply control circuitry is adapted to provide the first power source select signal and the linear amplifier power supply select signal, such that the first power source select signal and the linear amplifier power supply select signal are based on an envelope power supply control signal.

17. The circuitry of claim 11 wherein an envelope power supply control signal is representative of a setpoint of the envelope power supply signal, such that the first power source select signal is delayed relative to receipt of the envelope power supply control signal to compensate for processing delays of the envelope power supply control signal.

18. The circuitry of claim 7 further comprising ripple cancellation circuitry adapted to at least partially cancel ripple current associated with at least one inductive element in a supply using one of the DC source signal and the linear amplifier power supply output signal.

19. The circuitry of claim 18 wherein the ripple cancellation circuitry is further adapted to receive a second power source select signal, such that selection between using the one of the DC source signal and the linear amplifier power supply output signal is based on the second power source select signal.

20. The circuitry of claim 19 wherein the second power source select signal is based on a maximum amplitude of the envelope power supply signal.

21. The circuitry of claim 7 wherein during envelope tracking, the linear amplifier is further adapted to toggle between using the DC source signal and using the linear amplifier power supply output signal to at least partially provide the envelope power supply signal.

22. The circuitry of claim 21 wherein the linear amplifier power supply output signal is based on a maximum amplitude of the envelope power supply signal.

23. The circuitry of claim 21 wherein toggling between using the DC source signal and using the linear amplifier power supply output signal to at least partially provide the envelope power supply signal is based on a programmable threshold associated with the envelope power supply signal.

24. The circuitry of claim 7 wherein the linear amplifier power supply comprises a capacitor-based charge pump adapted to receive the DC source signal and provide the linear amplifier power supply output signal based on the DC source signal.

25. The circuitry of claim 24 wherein the one of the plurality of linear amplifier supply voltages is less than each of the balance of the plurality of linear amplifier supply voltages.

26. The circuitry of claim 24 wherein the one of the plurality of linear amplifier supply voltages is greater than each of the balance of the plurality of linear amplifier supply voltages.

27. The circuitry of claim 24 wherein the one of the plurality of linear amplifier supply voltages is less than at least one of the balance of the plurality of linear amplifier supply voltages and is greater than at least one of the balance of the plurality of linear amplifier supply voltages.

28. The circuitry of claim 1 wherein the linear amplifier power supply is further adapted to provide the entire plurality of linear amplifier supply voltages.

29. Circuitry wherein a linear amplifier is adapted to at least partially provide an envelope power supply signal to a radio frequency (RF) power amplifier (PA) using a selected one of a plurality of linear amplifier supply voltages and comprising:
   power supply control circuitry adapted to select one of the plurality of linear amplifier supply voltages based on a desired voltage of the envelope power supply signal;
   a linear amplifier power supply adapted to provide at least one of the plurality of linear amplifier supply voltages;
   a setpoint of the envelope power supply signal is based on the desired voltage of the envelope power supply signal; and
   an envelope power supply control signal is representative of the setpoint of the envelope power supply signal.

30. A method comprising:
   at least partially providing an envelope power supply signal to a radio frequency (RF) power amplifier (PA) using a selected one of a plurality of linear amplifier supply voltages, such that selection of the selected one of the plurality of linear amplifier supply voltages is based on a desired voltage of the envelope power supply signal; and
   using a linear amplifier power supply to provide at least one of the plurality of linear amplifier supply voltages, such that a setpoint of the envelope power supply signal is based on the desired voltage of the envelope power supply signal and an envelope power supply control signal is representative of the setpoint of the envelope power supply signal.

* * * * *